(12) United States Patent
Singh et al.

(10) Patent No.: US 6,456,988 B1
(45) Date of Patent: *Sep. 24, 2002

(54) METHOD FOR DETERMINING STATE-OF-HEALTH USING AN INTELLIGENT SYSTEM

(75) Inventors: Pritpal Singh, Media, PA (US); Craig Fennie, Jr., New Haven, CT (US); David E. Reisner, Bristol, CT (US)

(73) Assignee: U.S. Nanocorp Inc., North Haven, CT (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/041,501

(22) Filed: Mar. 12, 1998

Related U.S. Application Data

(60) Provisional application No. 60/040,476, filed on Mar. 12, 1997, and provisional application No. 60/051,165, filed on Jun. 27, 1997.

(51) Int. Cl.[7] .......................... G06F 15/18; G06F 19/00; H02J 7/00

(52) U.S. Cl. .......................... 706/2; 706/900; 706/902; 702/63; 320/132

(58) Field of Search .......................... 706/2, 900, 902; 702/63; 320/132

(56) References Cited

U.S. PATENT DOCUMENTS

| | | | |
|---|---|---|---|
| 3,720,869 A | 3/1973 | Rowlette | 324/29.5 |
| 3,895,284 A | 7/1975 | Schweizer et al. | 320/48 |
| 3,984,762 A | 10/1976 | Dowgiallo, Jr. | 324/29.5 |
| 4,307,330 A | 12/1981 | Belot | 320/44 |
| 4,433,295 A | 2/1984 | Zaugg | 324/429 |
| 4,595,880 A | 6/1986 | Patil | 324/427 |
| 4,638,237 A | 1/1987 | Fernandez | 320/48 |
| 4,677,363 A | 6/1987 | Kopmann | 320/48 |
| 4,743,855 A | 5/1988 | Randin et al | 324/430 |
| 4,775,827 A | 10/1988 | Ijntema et al. | 320/44 |
| 4,876,513 A | 10/1989 | Brilmyer et al. | 324/427 |
| 4,947,123 A | 8/1990 | Minezawa | 324/427 |
| 4,958,127 A | 9/1990 | Williams et al. | 324/426 |

(List continued on next page.)

FOREIGN PATENT DOCUMENTS

JP 6-242192 * 9/1994

OTHER PUBLICATIONS

Tanpo et al, "Prediction of the Capacity of Sealed Lead Battery by Neural Network", Conference Proceedings of the Institute of Electronics Information and Communication Engineers, 1996.*

Tanpo et al, "Development of a Battery Checking System Using Neural Network", Proceedings of the Joint Conference of Hokuriku Chapters of Institutes of Electrical Engineers, 1995.*

Shigenori et al, "Estimation of Residual Capacity of a Lead Battery Using Neural Networks", Conference Proceedings, 1993.*

Final Report for Nickel Cadmium Battery Expert System, Martin Marietta Corporation Airospace Division, 1986.*

(List continued on next page.)

*Primary Examiner*—George B. Davis
(74) *Attorney, Agent, or Firm*—Cantor Colburn LLP

(57) ABSTRACT

A method for determining state of health (SOH) of an electrochemical device using fuzzy logic (i.e., an intelligent system) is presented. State of health of an electrochemical device is determined by an internal characteristic parameter (or external operating and environmental conditions) of the electrochemical device and a characteristic parameter of a load with an intelligent system. The electrochemical device comprises such devices as primary ("throwaway") batteries, rechargeable batteries, fuel cells, hybrid batteries containing a fuel cell electrode or electrochemical supercapacitors. The intelligent system is trained in the relationship between the characteristic parameters of the electrochemical device, the characteristic parameters of the load and the SOH of the electrochemical device.

24 Claims, 13 Drawing Sheets

U.S. PATENT DOCUMENTS

| | | | |
|---|---|---|---|
| 5,159,272 A | 10/1992 | Rao et al. | 324/429 |
| 5,241,275 A | 8/1993 | Fang | 324/430 |
| 5,284,719 A | 2/1994 | Landau et al. | 429/50 |
| 5,321,627 A | 6/1994 | Reher | 364/483 |
| 5,349,540 A | 9/1994 | Birkle et al. | 364/578 |
| 5,369,364 A | 11/1994 | Renirie et al. | 324/430 |
| 5,372,898 A | 12/1994 | Atwater et al. | 429/90 |
| 5,381,096 A | 1/1995 | Hirzel | 324/427 |
| 5,404,106 A | 4/1995 | Matsuda | 324/431 |
| 5,451,881 A | 9/1995 | Finger | 324/433 |
| 5,457,377 A | 10/1995 | Jonsson | 320/5 |
| 5,541,489 A | 7/1996 | Dunstan | 320/2 |
| 5,587,660 A | 12/1996 | Chabbert et al. | 324/426 |
| 5,614,829 A | 3/1997 | Song | 324/427 |
| 5,631,540 A | 5/1997 | Nguyen | 320/30 |
| 5,654,903 A | 8/1997 | Reitman et al. | 364/551.01 |
| 5,656,919 A | 8/1997 | Proctor et al. | 320/30 |
| 5,659,240 A | 8/1997 | King | 320/30 |
| 5,670,861 A | 9/1997 | Nor | 320/15 |
| 5,701,078 A | 12/1997 | Lee et al. | 324/430 |
| 5,703,464 A * | 12/1997 | Karunasiri et al. | 320/1 |
| 5,705,929 A | 1/1998 | Caravello et al. | 324/430 |
| 5,825,156 A * | 10/1998 | Patillon et al. | 702/63 |
| 5,936,385 A * | 8/1999 | Patillon et al. | 320/136 |
| 6,011,379 A * | 1/2000 | Singh et al. | 320/132 |

OTHER PUBLICATIONS

Tanpo et al, "Estimation of the State of Charge of Sealed Lead Battery by Neural Networks," The Institute of Electronics, Information and Cummunication Engineers, 1996.*

Marcus Stoll,"Neural Networks—A Proper Approach to the Engery Management Problem?," Proceedings of the 10th E.C. Photovotaic Solar Energy International Conference, 1991.*

Ullah, et al, "Fast Intelligent Battery Charging: Neural Fuzzy Approach", IEEE AES Systems Magazine, Jun. 1996.*

Cerruto et al, "Energy Flows Management in Hybrid Vehicles by Fuzzy logic Controller", IEEE Proceedings of the 7th Mediterranean Electrotechnical Conference, Apr. 1994.*

Poulin et al, "An Expert Management System for VRLA Batteries in Remote Telecommunication Centers", IEEE Intelec, the 16th Inter. Telecommunications Energy Conference, Nov. 1994.*

Brady, et al, "A Symbolic Programming Approach to Intelligent Data Reduction", IEEE Proceedings of the 24th Intersociety Energy Conversion Engineering Conference, Aug. 1989.*

Naoki et al, "Estimation of the State of Charge of Sealed Lead Battery by Neural Networks" Institute of Electronics, Information and Communication Engineers, 1996.*

Naoki et al, "Prediction of the Capacity of Sealed Lead Battery by Neural Networks", Institute of Electronics, Information and Communication Engineers, 1996.*

Shigenori et al, "Estimation of Residual Capacity of a Lead Battery Using Neural Networks", Denki Gakkai Sangyo Keisoku Seigyo Kenkyukai Shiryo, 1993.*

Tanpo N., "Development of a Battery Checking System Using Neural Network", Proceedings of the Joint Conference of Hokuriku Chapters of Institute of Elect. Eng., 1995.*

Alex By Kat, "Design of an Expert System for Diagnosis of a Space Borne Battery Based Electric Power System", IEEE, IECEC, Proceedings of the 25th Intersociety Energy Conversion Engineering Conference, Aug. 1990.*

Taylor et al, "Standard Smart Batteries for Consumer Applications", IEEE Proceedings of the 10th Annual Battery Conference on Applications and Advances, Jan. 1995.*

Jean Alzieu, Hassan Smimite, Christian Glaize, *Improvement of intelligent battery controller: state–of–charge indicator and associated function,* Journal of Power Sources 1997, pp. 157–161.

Willaim Ross and Peter Budney, *Development of a Battery Runtime Prediction Algorithm and a Method for Determining its Accuracy,* IEEE 1995, pp. 277–283.

S.A.G.R. Karunathilaka, R. Leek, N.A. Hampson, M. Hughes and T.J. Sinclair, *A state–of–charge test for the Li–CuO cell,* Journal of Applied Electrochemistry (1983) pp. 351–354.

S. Sathyanarayana, S. Venugopalan, M.L. Gopikanth, *Impedance parameters and the state–of–charge. I. Nickel--cadmium battery,* Journal of Applied Electrochemistry (1979) pp. 125–139.

S.A.G.R. Karunathilaka, N. A. Hampson, M. Hughes, W. G. Marshall, R. Leek and T. J. Sinclair, *The prediction of the state–of–charge of some commerical primary cells,* Journal of Applied Electrochemistry (1983) pp. 577–586.

S.A.G. R. Karunathilaka, N. A. Hampson, T. P. Haas, W. G. Marshall, R. Leek and T. J. Sinclair, *The impedance of the alkaline zinc–mercuric oxide cell. I. Cell behaviour and interpretation of impedance spectra,* Journal of Applied Electrochemistry (1981) pp. 573–582.

* cited by examiner

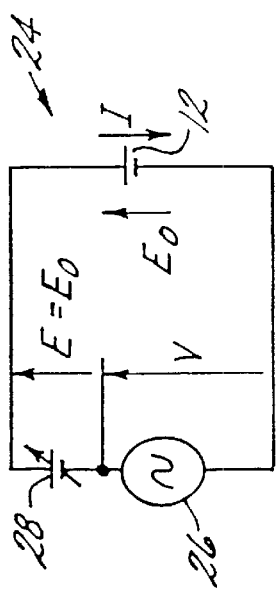
FIG. 4A
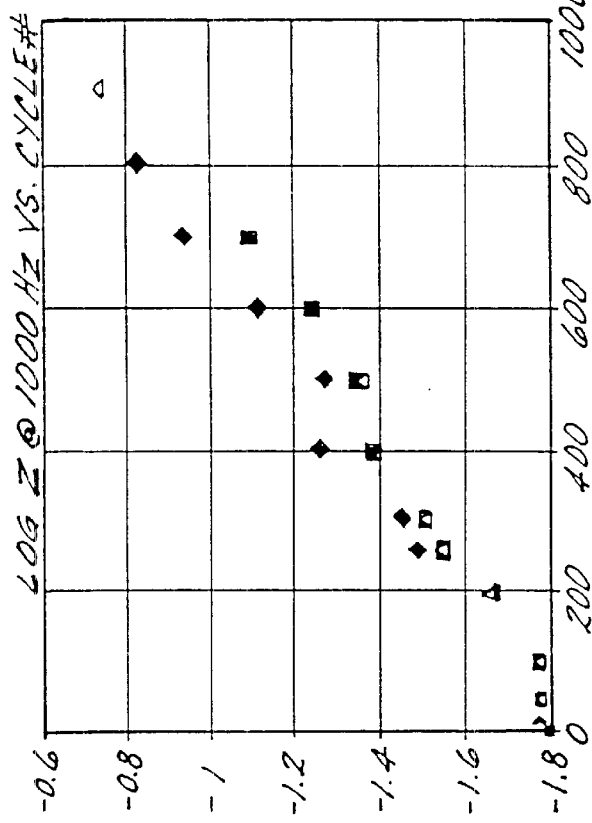
FIG. 4B
FIG. 4C

METHOD FOR DETERMINING STATE-OF-HEALTH USING AN INTELLIGENT SYSTEM

CROSS REFERENCE TO RELATED APPLICATIONS

This application claims the benefit of U.S. provisional patent application Ser. No. 60/040,476 filed Mar. 12, 1997 and U.S. provisional patent application Ser. No. 60/051,165 filed Jun. 27, 1997.

This invention was made with Government support under contract USZA22-97-P-0010 awarded by the U.S. Department of Defense. The Government has certain rights in the invention.

BACKGROUND OF THE INVENTION

The present invention relates to determining the state-of-health (SOH) of an electrochemical device. More particularly, the present invention relates to determining the SOH of an electrochemical device using an intelligent system, e.g. a fuzzy logic system.

The SOH of a battery has been interpreted in different ways by scientists/engineers in the field. In the case of valve regulated lead acid (VRLA) batteries used by utility companies, for providing emergency backup power, SOH is interpreted to mean that a battery is close to the end of its cycle life and needs replacement. Several papers including Feder and Hlavac 1994 INTELEC Conf. Proc. pp. 282–291 (1994) and Hawkins and Hand 1996 INTELEC Conf. Proc. pp. 640–645 (1996) demonstrate that the increase in impedance of aging VRLA batteries can be used to indicate the SOH of the battery.

Another interpretation of battery SOH is the capability of a battery to meet its load demand. This is also referred to as "battery condition" by others in the field. To obtain the SOH of a battery in the terms defined, both the available charge capacity of the battery and the maximum power available from the battery are required. Several approaches have been used to determine the condition of a battery. In U.S. Pat. No. 5,365,453 is described a method in which a ratio of a change in battery voltage to a change in load is used to predict impending battery failure in battery powered electronic devices. Similar methods in which the battery response to and recovery from the application of a load is used to determine the SOH of batteries are reported in U.S. Pat. Nos. 4,080,560 and 5,159,272. While these load profiling approaches work reasonably well for batteries integrated into a system, they are not necessarily accurate or reliable ways of determining the SOH of batteries outside a system.

SUMMARY OF THE INVENTION

The above-discussed and other drawbacks and deficiencies of the prior art are overcome or alleviated by the method for determining state of health (SOH) of an electrochemical device using an intelligent system, e.g., a fuzzy logic system, of the present invention. In accordance with the present invention, the state of health of an electrochemical device is determined by an internal characteristic parameters (or external operating and environmental conditions) of the electrochemical device and characteristic parameters of a load and the SOH of the electrochemical device with an intelligent system. The electrochemical device comprises such devices as primary ("throwaway") batteries, rechargeable batteries, fuel cells, a hybrid battery containing a fuel cell electrode and electrochemical supercapacitors. The intelligent system is trained in the relationship between characteristic parameters of the electrochemical device, characteristic parameters of the load and the SOH of the electrochemical device.

The intelligent system comprises any system that adaptively estimates or learns continuous functions from data without specifying how outputs depend on inputs. By way of example, the intelligent system includes an artificial neural system, a fuzzy system and other such model-free function estimators that learn. Learning, so-called, "tunes" an intelligent system. This learning process (also referred to as a training process) can be implemented in many ways. The intelligent system can be implemented using: an algorithm such as radiant descent and clustering used to tune neural networks and adaptive fuzzy systems; search optimization techniques such as those used by genetic algorithms; or an expert's guesses or trials and errors such as those used in fuzzy expert systems and fuzzy systems.

The above-discussed and other features and advantages of the present invention will be appreciated and understood by those skilled in the art from the following detailed description and drawings.

BRIEF DESCRIPTION OF THE DRAWINGS

Referring now to the drawings wherein like elements are numbered alike in the several FIGURES:

FIG. 4A is a schematic diagram of a circuit for measuring battery impedance;

FIG. 4B is a block diagram of an equivalent circuit model characteristic parameter extraction device of FIG. 3;

FIG. 4C is a plot of the log of the impedance versus battery cycle number;

DESCRIPTION OF THE INVENTION

Figure 1:
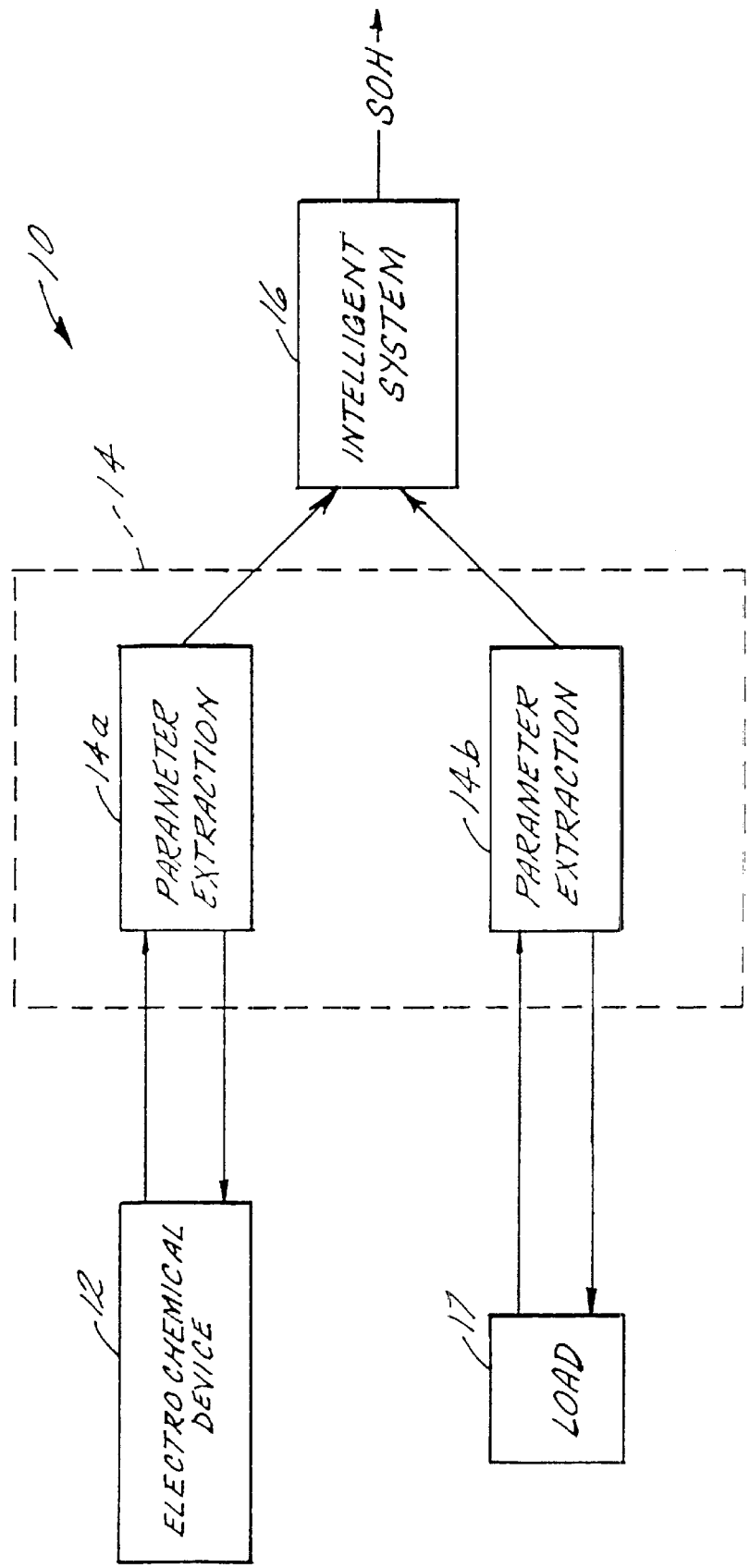
FIG. 1 is a block diagram of a method for determining state of health of an electrochemical device in accordance with the present invention.

Referring to FIG. 1, a system for determining State-of-Health (SOH) in accordance with the present invention is generally shown at 10. System 10 comprises an electrochemical device 12 for which SOH is to be determined, a parameter extraction device 14 and an intelligent system 16. Electrochemical device 12 comprises such devices as primary ("throwaway") batteries, rechargeable batteries, fuel cells, a hybrid battery containing a fuel cell electrode and electrochemical supercapacitors. Intelligent system 16 is trained in the relationship between characteristic parameters of electrochemical device 12 (parameter extraction device 14a) and characteristic parameters of a load 17 (parameter extraction device 14b), and the SOH of electrochemical device 12. These characteristic parameters are obtained by device 14 and provided to intelligent system 16 as inputs, with the SOH being the output of intelligent system 16.

The state of health of an electrochemical device 12 is defined as the device's ability to perform a specified task. Although an electrochemical device 12 may be at a high State-of-Charge (SOC), its health may be poor due to loss of electrolyte or otherwise. Although a fully discharged battery may be at a low SOC, due to depletion of the charged species of the electrodes or otherwise, it may well be in a full SOH, which would be realized subsequent to recharging the electrochemical device. Phenomenons such as loss of electrolyte and depletion of charged species affect the electrochemical device's power delivery capability and its capacity. Therefore, the electrochemical device's State-of-Health is a function of its ability to deliver the power required by a load and its capacity to meet the load requirements.

Intelligent system 16 comprises any system that adaptively estimates or learns continuous functions from data without specifying how outputs depend on inputs, such as described in Neural Networks and Fuzzy System, by Bart Kosko, Prentice-Hall, 1992, which is incorporated herein by reference. By way of example, intelligent system 16 includes, but is not limited to, an artificial neural system, a fuzzy system and other such model-free function estimators that learn. Learning, so-called, "tunes" an intelligent system. The learning process (also referred to as a training process) can be implemented in many ways. Intelligent system 16 can be implemented using an algorithm such as gradient decent and clustering used to tune neural networks and adaptive fuzzy systems, such as described in Neural Networks and Fuzzy System, by Bart Kosko, Prentice-Hall, 1992. Intelligent system 16 can also be implemented using search optimization techniques such as those used by genetic algorithms, see Genetic Algorithm and Fuzzy Logic System, Soft Computing Perspective (Advances in Fuzzy Systems—Applications and Theory, Vol. 7), by Elie Sanchez et al, World Scientific Pub. Co., 1997, which is incorporated herein by reference. Alternatively, intelligent system 16 can be implemented by an expert's guesses or trials and errors such as those used in fuzzy expert systems and fuzzy systems, see Timothy J. Ross, McGraw Hill, 1995, which is incorporated herein by reference. It will be appreciated that combinations of the above may also be employed, such as a fuzzy system/adaptive fuzzy system that uses gradient decent and/or clustering to develop an initial fuzzy system, then uses an expert's knowledge to fine tune the system, see Neural Networks and Fuzzy System, by Bart Kosko, Prentice-Hall, 1992, which is incorporated herein by reference.

Figure 2:
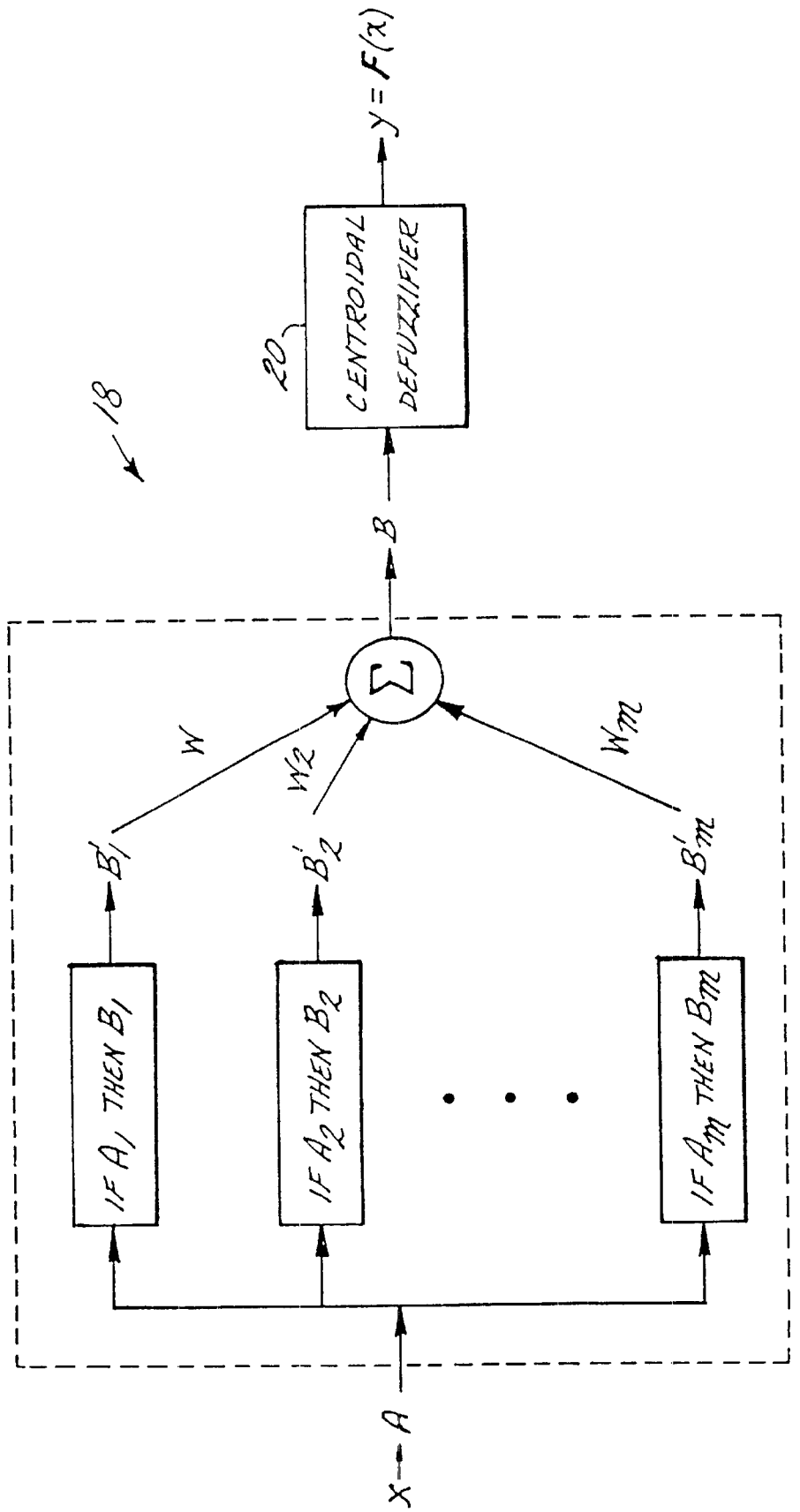
FIG. 2 is a block diagram of an additive fuzzy system for use in the intelligent system of the present invention.

Referring to FIG. 2, intelligent system 16 in a preferred embodiment comprises an additive fuzzy system 18 with centroid defuzzification 20. Additive fuzzy system 18, F, stores m fuzzy rules of the form, "If X is $A_j$ then Y is $B_j$", and computes the output F(x) as the centroid of the summed and partially fired then-part fuzzy sets $B'_j$, see Fuzzy Engineering, by Bart Kosko, Prentice-Hall, 1997. Mathematically additive fuzzy system 18 is expressed by Equation 1 as:

$$F(x) = \frac{\sum_{j=1}^{m} w_j a_j(x) V_j c_j}{\sum_{j=1}^{m} w_j a_j(x) V_j} \quad \text{EQUATION 1}$$

$$a_j(x) = \prod_{i=1}^{n} a_j^i(x_i) \quad \text{EQUATION 2}$$

$$B = \sum_{j=1}^{m} w_j B'_j = \sum_{j=1}^{m} w_j a_j(x) B_j \quad \text{EQUATION 3}$$

where:
$w_j$ is a weight of rule j,
$a_j^i$ represents if-part set function (membership function of input i of rule j on input i),
$a_j$ represents joint if-part set function (result of "$a_j^1$ 'and' $a_j^2$ ... 'and' $a_j^i$") that states the degree to which the input x belongs to the if-part fuzzy set $a_j$,
$B_j$ represents then-part set function (membership function j on the output),
$V_j$ is the finite positive volume (or area) of the then-part set $B_j$,
$c_j$ is the centroid of the then-part set $B_j$,
$B'_j$—scaled then-part set (scaled output membership function j, result of $a_j(x)B_j$), and
B—output set prior to defuzzification.

In linguistic terms, additive fuzzy system 18 can be described in terms of a set of if-then rules:
RULE 1: If $X_1$ is $a^1_1$ and $X_2$ is $a^2_1$ ... and $X_n$ is $a^n_1$, then F(X) is $B_1$,
RULE 2: If $X_1$ is $a^1_2$ and $X_2$ is $a^2_2$ ... and $X_n$ is $a^n_2$, then F(X) is $B_2$,
RULE m: If $X_1$ is $a^1_m$ and $X_2$ is $a^2_m$ ... and $X_n$ is $a^n_m$, then F(X) is $B_m$,
where m is the number of rules and n is the number of inputs.

The linguistic description and the mathematical description of additive fuzzy system 18 are equivalent. They are merely different views of the same fuzzy system. Both approaches map a given input X to a given output F(X) by a process known as fuzzy inference. The following example demonstrates the fuzzy inference process. First, fuzzify the inputs by taking the inputs and determine the degree to which they belong to each of the appropriate input fuzzy sets via membership functions. Mathematically expressed as: "$a_1^1(X_1)$, $a_1^2(X_2)$, ..., $a_1^m(X_m)$". Linguistically expressed as: "If $X_1=a_1^1$, If $X_2=a_1^2$, ..., If $X_m=a_1^m$". Second, apply a fuzzy operator by combining if-part sets of a given rule to obtain one number that represents the result of the antecedent for that rule. Mathematically expressed as EQUATION 2 hereinabove. Linguistically expressed as: "$a_1^1$ 'and' $a_1^2$ 'and' $a_1^m$" where 'and' is the T-norm product. Third, apply an implication method by shaping the consequent (or output fuzzy set) based on the result of the antecedent for that rule. Mathematically expressed as: "$B'_1=a_1(X)B_1$". Linguistically expressed as: "If $a_1(X)$, then $B_1$". Fourth, aggregate all outputs by combining the consequent of each rule to form one output fuzzy set. Mathematically expressed as EQUATION 3 hereinabove. Fifth, defuzzify by mapping the output fuzzy set to a crisp number. Mathematically expressed as "F(x)=centroid(B)=EQUATION 1". In general see Fuzzy Logic Toolbox, for use with MATLAB, The Mathworks, Inc. by Jang and Gulley.

By way of example, a supervised gradient descent, can learn or tune additive fuzzy system 18 given by EQUATION 1 by changing the rule weights $w_j$, the then-part volumes $V_j$, the then-part centroids $c_j$, or the if-part set functions $a_j$.

Figure 3:
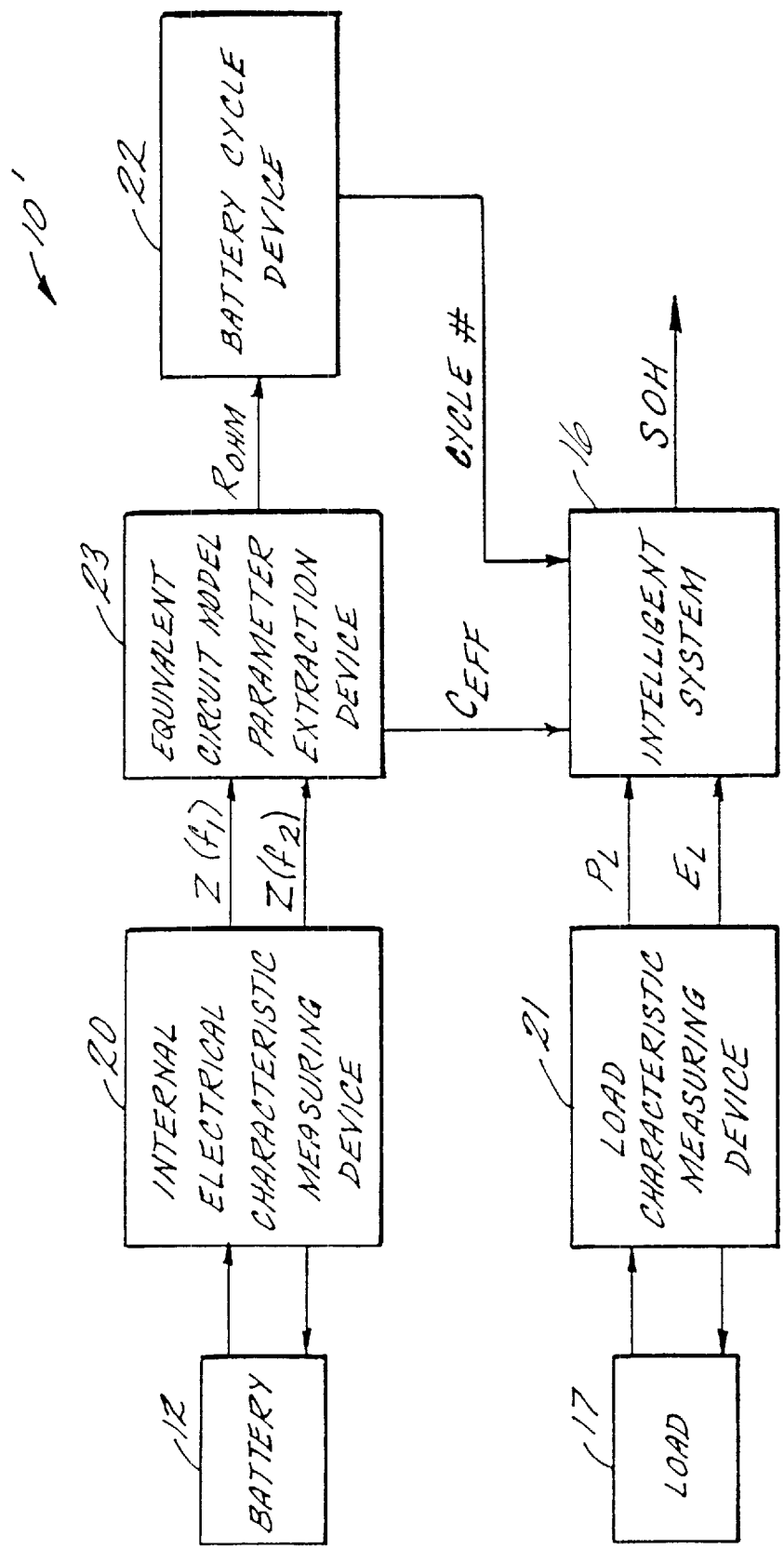
FIG. 3 is a block diagram of a method for determining state of health of an electrochemical device in accordance with an embodiment of the present invention.

Referring to FIG. 3, system 10' determines the SOH of battery 12 by relating the relationship between internal electrical characteristics of an electrochemical device 12 and the characteristics of a load 17, and the SOH of an electrochemical device 12. In the preferred embodiment the internal electrical characteristic measuring device comprises an impedance measuring device. System 10' comprises battery 12 for which the SOH is to be determined, load 17, an impedance measuring device 20, a load characteristic measuring device 21, and preprocessor and intelligent system 16. In the preferred embodiment the preprocessor comprises a equivalent circuit parameter extraction device 23 and a battery cycle device 22.

Referring to FIG. 4A, a circuit 24 for measuring battery impedance is shown. Circuit 24 comprises battery 12 whose impedance is to be measured, an a.c. voltage generator 26 of variable frequency, and a d.c. variable voltage generator 28. Battery 12 and generators 26 and 28 are connected in series in any order but in such a way that battery 12 and the d.c. generator 28 have in common poles of the same sign, in this example the positive poles. The no-load voltage of battery 12 is designated as $E_0$, the effective voltage of a.c. generator 26 is designated as V and the voltage of d.c. generator 28 is designated as E. Voltage E is chosen so as to be equal to $E_0$ to prevent battery 12 issuing a direct current. In this way, the current flowing in the loop made up of battery 12 and generators 26 and 28 has no direct component and its alternating component designated I is determined by the voltage V. Variables V and I are complex numbers and their ratio $V/I=Z=Z'+jZ''$ defines the internal complex impedance of battery 12. This impedance has a real or resistive part $Z'$ and an imaginary or reactive part $Z''$. The magnitude of this impedance, $|Z|$, is given by $|Z|=(Z'^2+Z''^2)^{1/2}$. The battery impedance is a function of the frequency f of the a.c. voltage. In some cases, the battery impedance at a particular frequency also changes with the battery's cycle number. A charged battery that is discharged and then recharged to its original state is said to have gone through a complete battery cycle. A battery's cycle number is the cumulative number of cycles that the battery has gone through.

Referring now to FIG. 4B, equivalent circuit model parameter extraction device 14 is shown for extracting electrical parameters from the impedance data (i.e., $Z(f_{4\,Hz})$, $Z(f_{1000\,Hz})$). It has been determined that in the case of nickel metal hydride batteries, the battery impedance measured at a frequency of 1000 Hz correlates well with the battery cycle number above about 100 cycles, see Doctoral Dissertation of John Weckesser, entitled An Evaluation of the Electrochemical Properties of Metal Hydride Alloys For Rechargeable Battery Applications, Rutger University (1993), which is incorporated herein by reference.

Referring to FIG. 4C, variation of the logarithm of the impedance (log Z) with battery cycle number for a nickel metal hydride battery is shown. This data allows determination of the battery cycle number (almost independently of battery state of charge) above about 100 cycles. Further, series capacitance of nickel metal hydride batteries varies with both cycle number and battery state of charge. Also, the values of the series capacitance of the nickel metal hydride batteries can be determined by measuring the internal impedance of the batteries at many frequencies and using a circuit model with different circuit elements to fit the complete impedance spectrum, again see Doctoral Dissertation of John Weckesser, Rutger University (1993).

Figure 5:
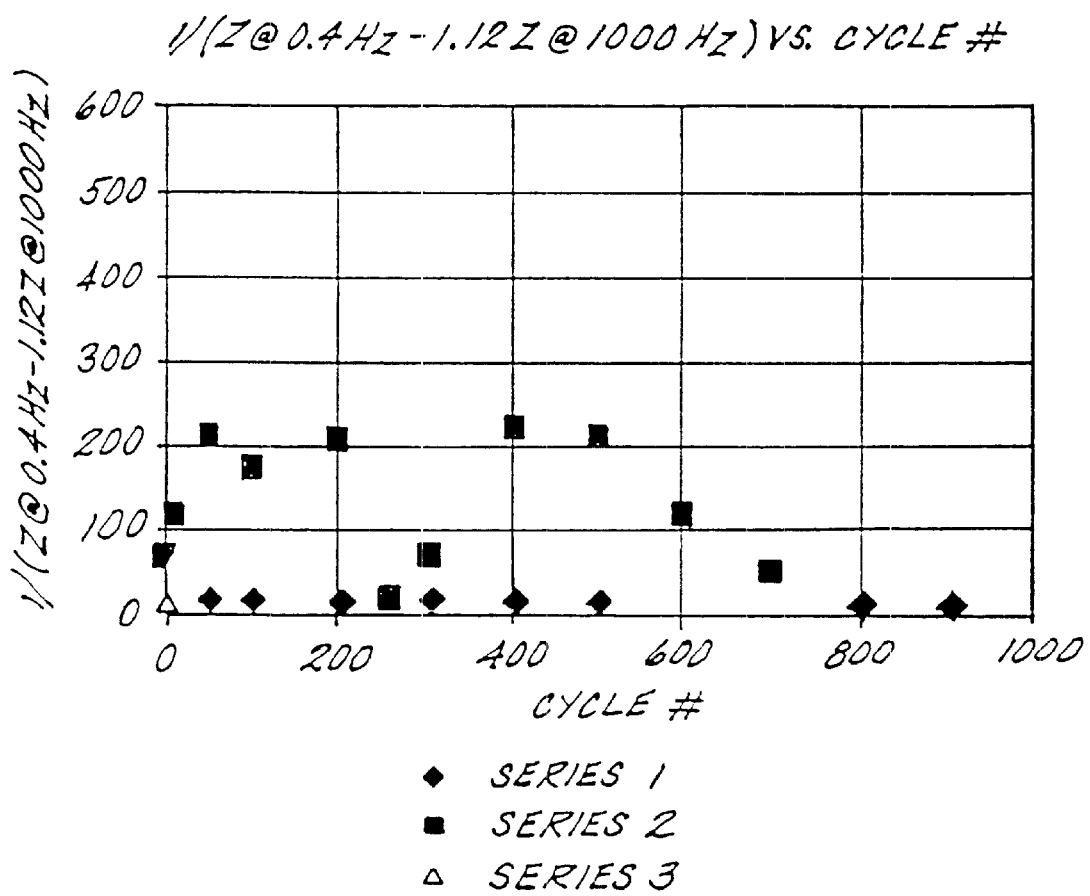
FIG. 5 is a plot of impedance function as a function of SOC versus Cycle #.

In accordance with the present invention, an effective series capacitance value can be determined by a simple analysis of the battery impedance measured at two frequencies. The effective series capacitance is obtained by measuring the impedance of the battery at 0.4 Hz and measuring the impedance at 1000 Hz. The effective series capacitance is given by the expression $C_{eff}=1/(Z(f_{4Hz})-1.12\,Z(f_{1000\,Hz}))$. A plot of this function is shown in FIG. 5, wherein a similar functional relationship to the battery cycle number and battery state of charge is found. This is used by system 10' to determine battery 12 state of charge (SOC) given battery 12 impedance measurements made at 0.4 Hz and 1000 Hz.

Figure 6:
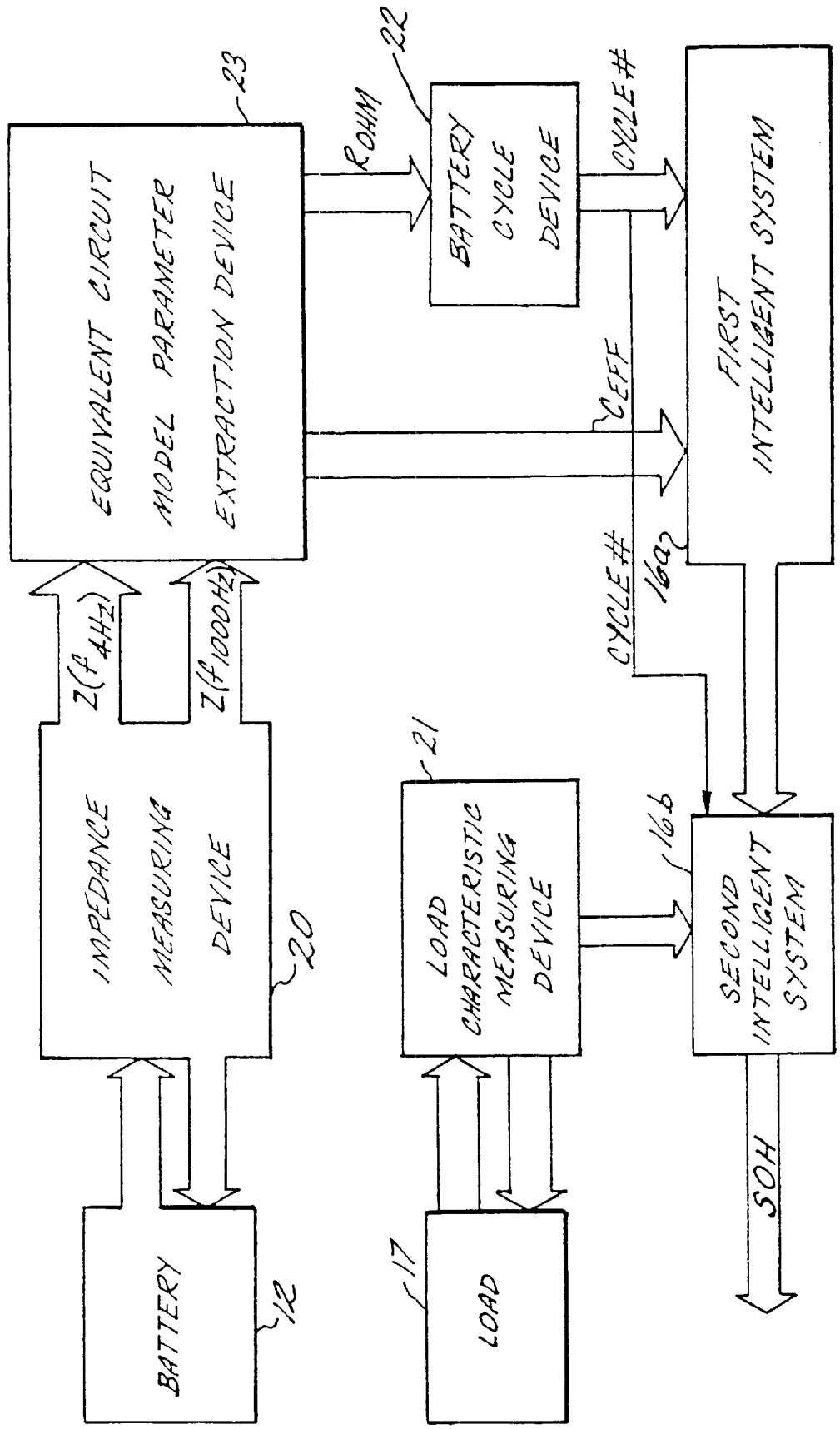
FIG. 6 is a block diagram of an intelligent system for use in determining state of health of the present invention.

Referring to FIG. 6, intelligent system 16 comprises a first intelligent system 16a which is trained in the relationship between the internal electrical characteristics and the SOC of the battery, whereby the intelligent system 16 learns the underlining function $f$ that relates $C_{eff}$ and Cycle #($f_{rc}$ ($R_{ohm}$)) to SOC. First intelligent system 16a receives the equivalent circuit model characteristic parameters of the electrochemical device as inputs and provides the SOC of the electrochemical device as output. A method for determining the characteristic parameters of the electrochemical device, such as SOC and Cycle #, is described in a U.S. patent application Ser. No. 09/041,562 entitled A Method For Determining State-Of-Charge Using An Intelligent System filed concurrently herewith which is incorporated herein by reference.

Intelligent system 16 further comprises a second intelligent system 16b which is trained in the relationship between the characteristic parameters of an electrochemical device, including SOC and cycle #, and the characteristic parameters of the load, including power and energy requirements, and the SOH. Second intelligent system 16b receives the SOC produced by first intelligent system 16a and the cycle # extracted from the equivalent circuit model parameters of the electrochemical device and the characteristic load requirements as inputs and outputs the SOH of the electrochemical device.

Figure 7A:
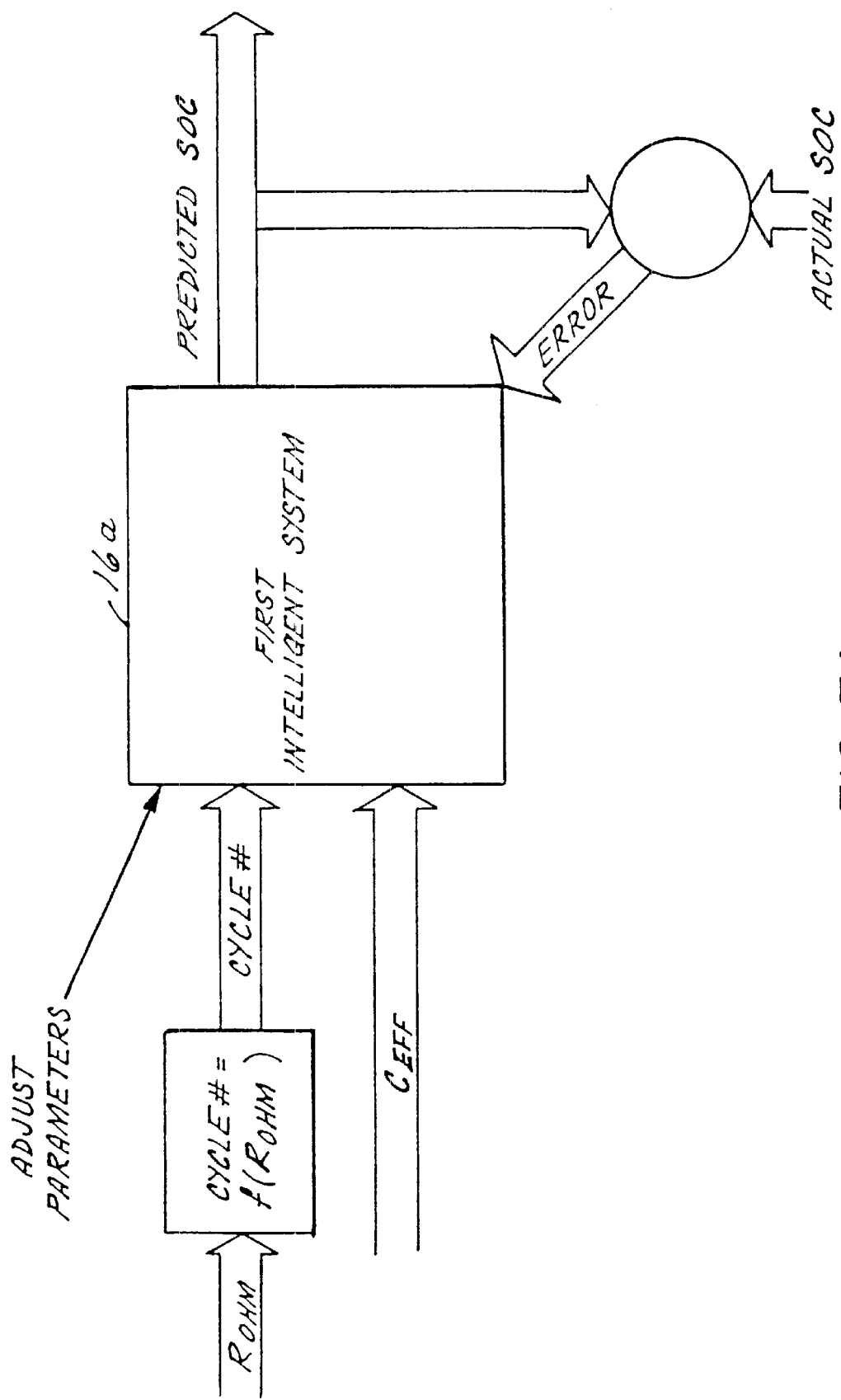
FIG. 7A is a block diagram of a first intelligent system of the present invention.

Referring to FIG. 7A, first intelligent system 16a is trained in the relationship between the equivalent circuit model internal electrical characteristic parameters and the SOC of the battery. First intelligent system 16a learns the underlying function $f_1$ that relates $C_{eff}$ and Cycle #($f_{rc}$ ($R_{ohm}$)) to SOC.

Figure 8A:
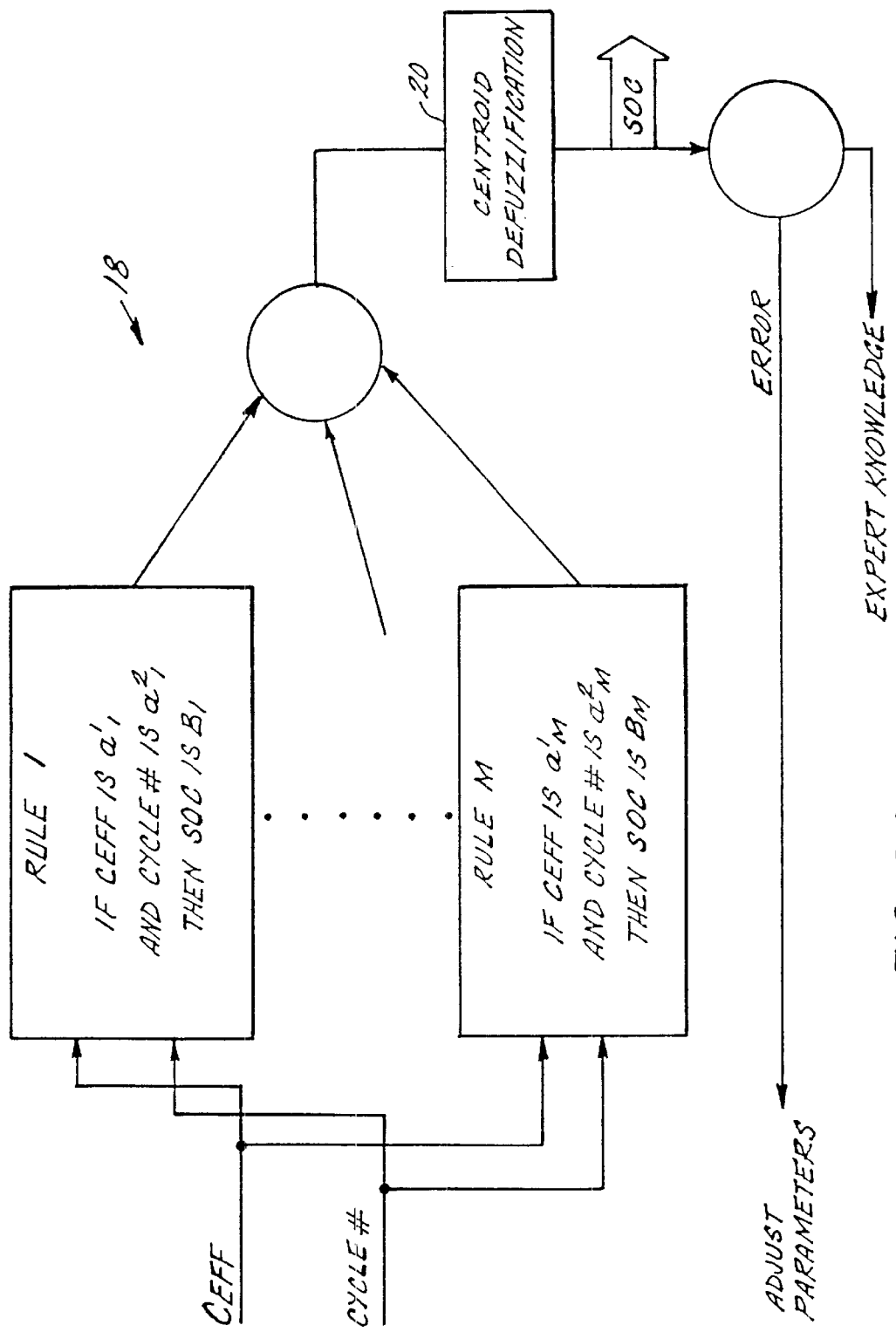
FIG. 8A is a block diagram of a first additive fuzzy system for use in the first intelligent system of FIG. 7A.

Referring to FIG. 8A, first intelligent system 16a comprises an additive fuzzy system 18 which learns the relationship between input variables, $C_{eff}$ and Cycle #, and output variables, battery SOC, by use of an expert knowledge and trials and errors. It will be appreciated that any learning method previously discussed can be used to tune the fuzzy system. Also that any intelligent system previously mentioned can be employed in place of the additive fuzzy system.

Figure 7B:
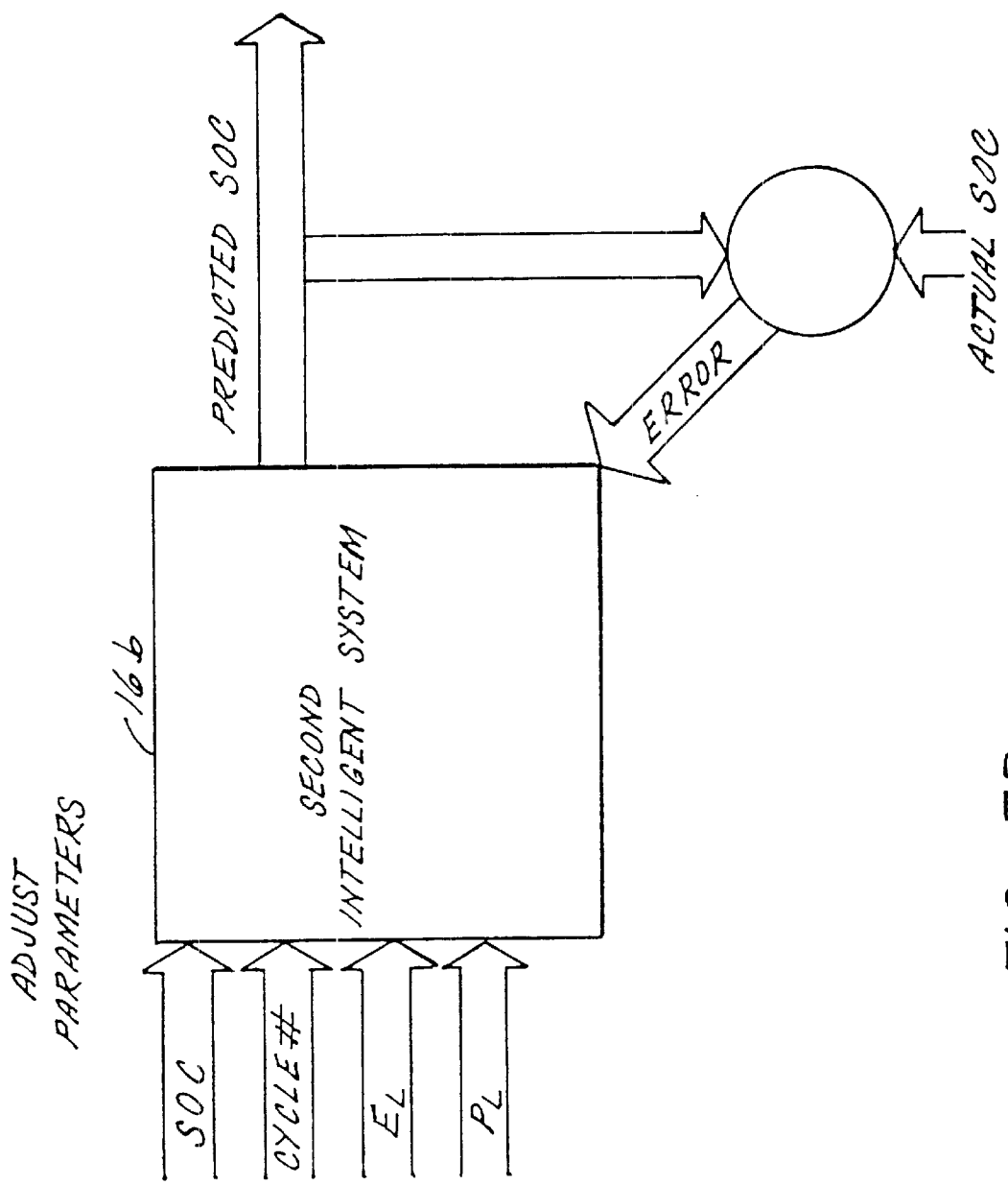
FIG. 7B is a block diagram of a second intelligent system of the present invention.

Referring to FIG. 7B, the second intelligent system 16b is trained in the relationship between the SOC and Cycle # of the battery, $E_1$ energy required by load, and $P_1$ power required by load, and the SOH. Second intelligent system 16b learns the underlying function $f_2$ that relates SOC and Cycle #($f_{rc}$($R_{ohm}$)) of a battery, $E_1$ and $P_1$ of the load, to the battery's SOH.

Figure 8B:
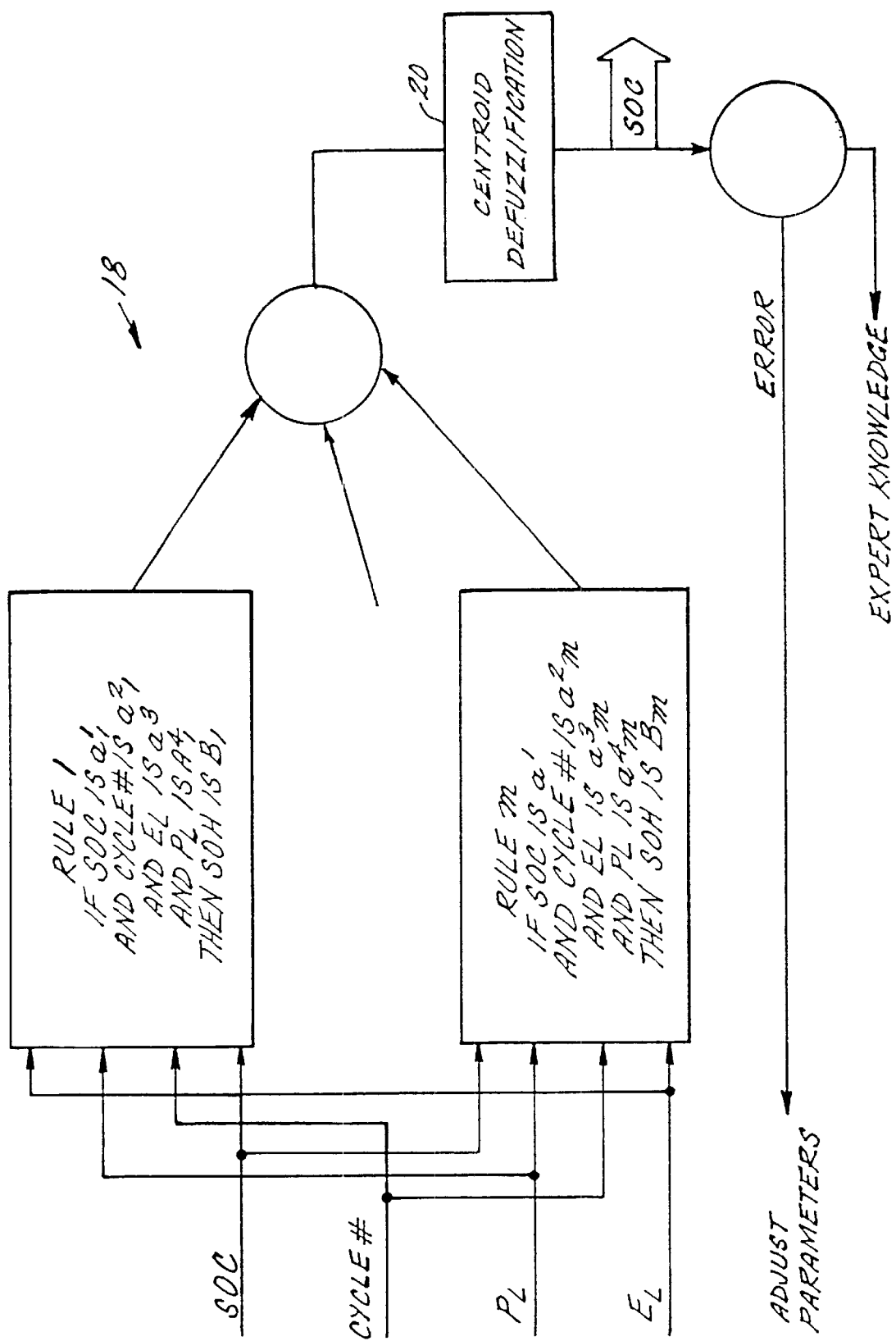
FIG. 8B is a block diagram of a second additive fuzzy system for use in the second intelligent system of FIG. 7B.

Referring to FIG. 8B, second intelligent system, 16b comprises a second additive fuzzy system 19 which learns the relationship between input variables, SOC, Cycle #, provided by first intelligent system 16a, $E_1$ energy required by load and $P_1$ power required by load provided by a user, and output variables, battery SOH, by use of an expert's knowledge and trials and errors. It will be appreciated that any learning method previously discussed can be used to tune the fuzzy system. Also that any intelligent system previously mentioned can be employed in place of the additive fuzzy system.

Figure 8C:
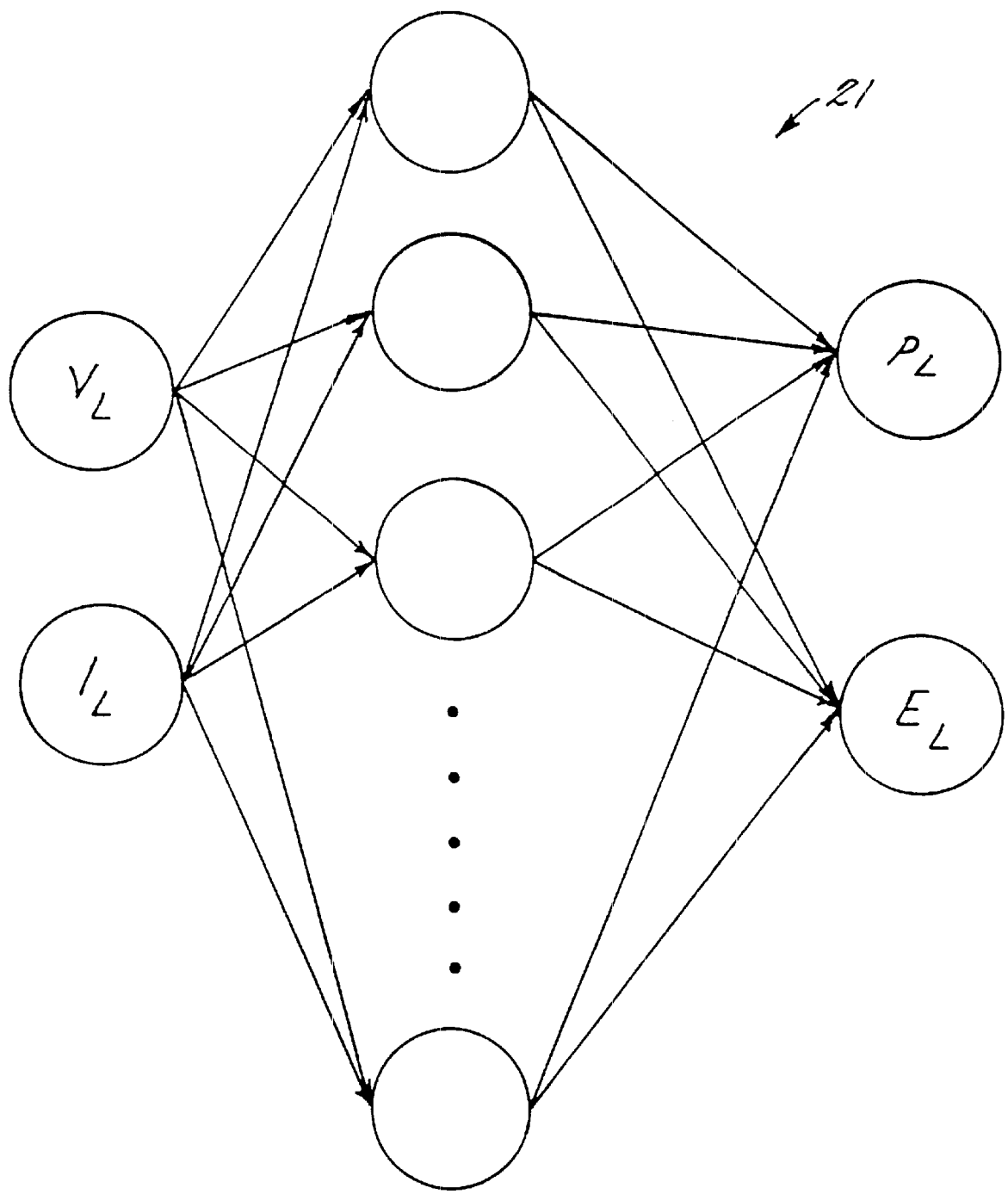
FIG. 8C is a block diagram of the second intelligent system in accordance with alternate embodiment of the present invention.

Referring to FIG. 8C, alternatively in second intelligent system 16a, the characteristic parameters of the load are learned online by a neural network 21. Neural network 21 takes as inputs, characteristics of the load discharging profile including, the voltage across the load $V_1$ and the discharge current $I_1$ through the load as a function of time, and outputs estimates of the power $P_1$ and energy $E_1$ requirements of the load. Neural network $Z_1$ forecasts the power $P_1$ and $E_1$ requirements of the load based on the load $V_1$ and the discharge current $I_1$ at a plural of times.

It will be appreciated that the SOH of battery 12 is really a function of the complex impedance and load requirements, and that the parameters, SOC and Cycle # are useful but are not in and of themselves required in a fuzzy system model. The direct relationship between the complex impedance and SOC is as follows:

$$SOH = f_2(SOC, \text{Cycle \#}, E1, P1) \quad \text{EQUATION 4,}$$

$$SOC = f(C_{\mathit{eff}}, \text{Cycle \#}) \quad \text{EQUATION 5,}$$

$$\text{Cycle \#} = f_{rc}(R_{ohm}) = f_{rc}(f(Z(f_{1000}))) = f_{rc}(Z(f_{1000})) \quad \text{EQUATION 6,}$$

therefore, $$SOH = f(Z(f_4), Z(f_{1000}), E_1, P_1) \quad \text{EQUATION 7.}$$

Intelligent system 16 may be trained directly in the relationship between the impedance, $Z_{4\,Hz}$ and $Z_{1000\,Hz}$, the power/energy requirements of the load and SOH. It will be appreciated that the present embodiment is not dependent upon the impedance at the particular frequencies, 0.4 Hz and 1000 Hz, such being merely exemplary.

Figure 9A:
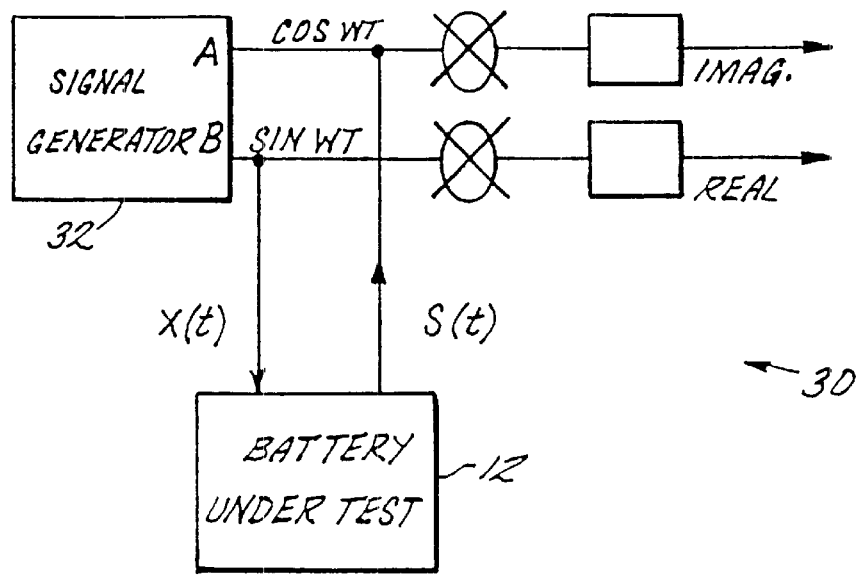
FIG. 9A is a circuit block diagram for determining battery impedance in accordance with the present invention.

Referring to FIG. 9A, a circuit 30 for measuring impedance of battery 12 at two frequencies is generally shown. Circuit 30 comprises battery 12 whose impedance is to be measured and an a.c. signal generator 32. A small amplitude, perturbing sinusoidal signal, $x(t) = X_0 \sin(\omega t)$, is applied to battery 12. The response of battery 12 to this perturbing signal is $S(t) = X_0 K(\omega) \sin(\omega[t + \phi(\omega)])$ and is correlated with two reference signals, one in phase with x(t) and the other 90° out of phase with x(t), i.e., $\sin(\omega t)$ and $\cos(t\omega)$, in order to calculate:

$$\mathfrak{R} = \frac{1}{T} \int_0^T S(t) \sin \omega t \, dt \quad \text{EQUATION 8}$$

$$\mathfrak{I} = \frac{1}{T} \int_0^T S(t) \cos \omega t \, dt \quad \text{EQUATION 9}$$

This allows the elimination of higher order harmonics than the fundamental and with an appropriate selection of a frequency window and multiple measurements, noise rejection can be very high. In the limit as $$T \to \infty, \quad \mathfrak{R} \to K(\omega) \cos \phi(\omega), \quad \mathfrak{I} \to K(\omega) \sin \phi(\omega),$$

where $K(\omega)$ represents the amplitude of the impedance at frequency $\omega/2\pi$ and $\phi(\omega)$ represents the phase of the impedance at frequency $\omega/2\pi$. Circuit 30 allows the determination of the impedance at different frequencies and may be set up to measure the impedance at the two frequencies of interest, such an instrument which can be used to perform the impedance measurements is commercially available as the Solartron 1260 Impedance/Gain-Phase Analyzer.

Figure 9B:
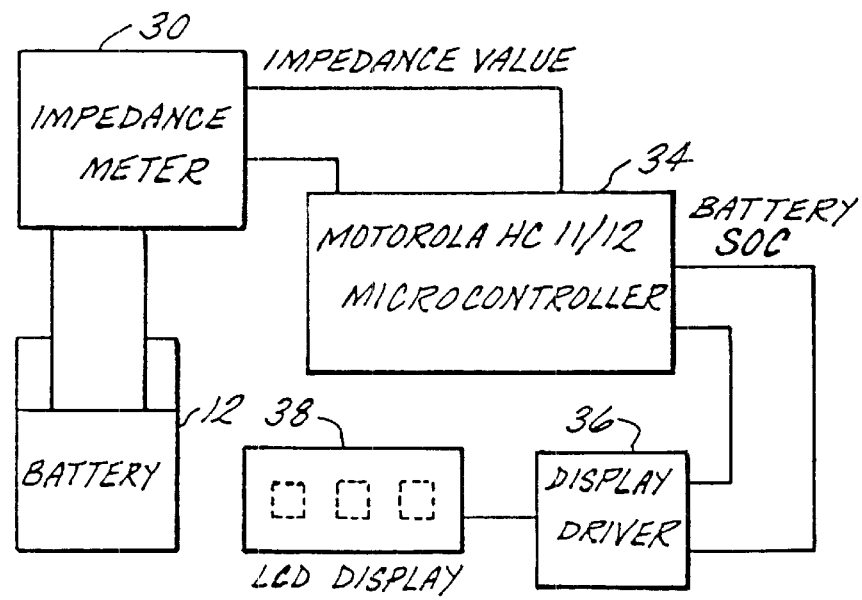
FIG. 9B is a circuit block diagram for determining state of charge in accordance with the present invention.

To determine battery SOC once the impedance is known, a circuit 34 (FIG. 9B) may be used. The impedance values at the two frequencies from circuit 30 are fed into a microcontroller 34 (e.g., Motorola MC68HC11/12) either as analog or digital signals, analog signals would be fed into the A/D converters on microcontroller 34 where they would be converted to digital signals. The impedance at 1000 Hz., $Z_1$, is stored in a first one memory location and the impedance at 0.4 Hz., $Z_2$, is stored at a second memory location. The impedance $Z_2$ is then multiplied by a factor of, e.g., 1.12 in microcontroller 34 and the result stored in a third memory location. The difference between $Z_1$ and $1.12 \times Z_2$ is then calculated in microcontroller 34 and the difference stored in a fourth memory location. The inverse of this quantity located in the fourth memory location is then calculated and the result stored in a fifth memory location. The cycle number is stored at a sixth location and the and the impedance stored in the fifth memory location serve as the input variables for the fuzzy system to determine battery 12 state of charge, as described above. The output of this first fuzzy system and the SOC, is stored in a seventh memory location. The load requirement, provided by either the user or a neural network trained to predict the load requirements based upon the past discharging characteristics are stored in an eighth memory location $E_1$ and $P_1$ is stored in a ninth memory location. The cycle number stored in the sixth memory location, the SOC stored in the seventh memory location, $E_1$ stored in the eighth memory location, and $P_1$ ninth memory location serve as input variables for the second fuzzy system to determine the battery's SOH. The battery state of health is then output to a display driver 36 and interfaced to a liquid crystal display 38.

Figure 10:
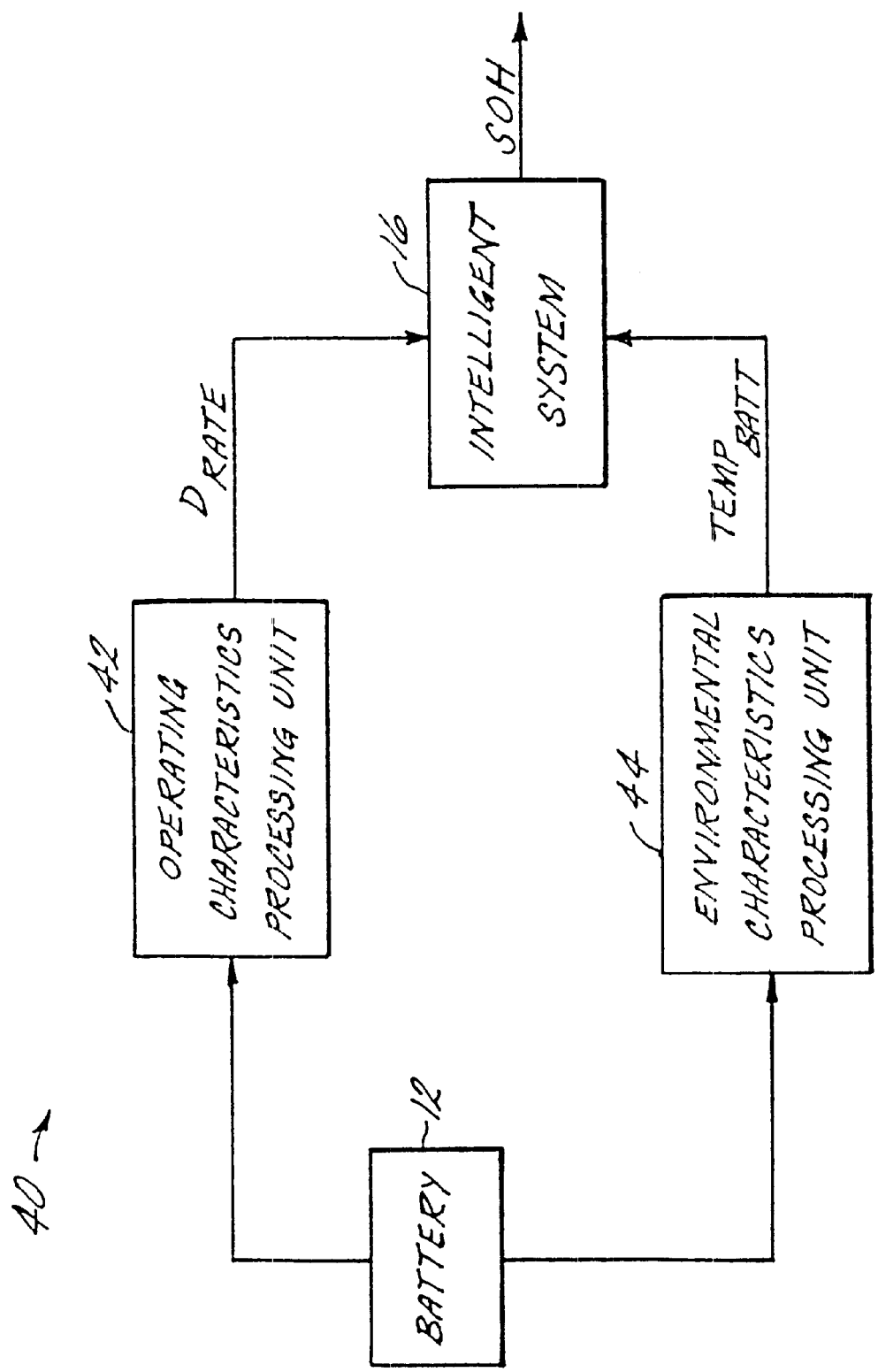
FIG. 10 is a block diagram of a method for determining state of charge of an electrochemical device in accordance with another embodiment of the present invention.

Referring to FIG. 10, an alternative system for determining the SOH of battery 12 by relating the external operating conditions such as, e.g., discharge rate, cycle number, calendar life and recovery time to a specified open circuit voltage (OCV) after a deep discharge and environmental conditions such as, e.g., temperature, battery orientation, magnetic field and g-force, and which infer the discharge efficiency to its SOH is generally shown at 40. System 40 comprises battery system 12 for which SOH is to be determined, an operating characteristic processing unit 42, an environmental characteristic processing unit 44, intelligent system 16 and a processing unit 46 for determining SOH.

In this embodiment, intelligent system 16 comprises intelligent system 16a which is trained in the relationship between the external operating conditions, including discharge rate, battery voltage, both as a function of time and environmental conditions, such as temperature, of an electrochemical device and the SOC of the electrochemical device. First intelligent system 16a receives the external operating conditions and environmental conditions as inputs and provides SOC (and the Cycle # for a rechargeable battery) of the electrochemical device as output. Intelligent system 16 further comprises a second intelligent system 16b which is trained in the relationship between the external operating conditions and environmental conditions, and the characteristic load requirement. Second intelligent system 16b receives the external operating conditions, including discharge rate, battery voltage, both as a function of time and environmental conditions, such as temperature, of the electrochemical device as inputs, and outputs the characteristic load requirements, including the power and energy requirements. Intelligent system 16 also comprises a third intelligent system 16c which takes the output of first intelligent system 16a, SOC, and the output of second intelligent system 16b, characteristic load requirements, as inputs and determines the battery SOH as an output.

It is within the scope of the present invention that power management specifications may be determined for a Smart Battery System (SBS). Intelligent system 16 is trained in the relationship between the battery characteristic parameter including the operating conditions of a battery and the equivalent circuit parameters of a battery, and characteristic load parameters including the load power and the load energy requirement, and the detailed SOH of the battery. The detailed SOH of a battery comprises the power management specifications according to the SBS standards. This includes the battery SOC, remaining capacity, time remaining at present discharge rate, predicted time remaining at a host specified rate, etc. (see, "Smart Battery System Overview" by Francis Truntzer, Intel Corporation, Proceedings of Developer's Conference and Interoperability Workshop, Hawaii (February 1998), which is incorporated herein by reference).

It is also within the scope of the present invention that SOH as related to a battery's end of cycle life can easily be determined when characteristic parameters of a load are inputted into the intelligent system and the SOH of the battery is outputted.

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. A method of determining a state of health of an electrochemical device connected to a load, comprising:
    detecting at least one characteristic of said electrochemical device;
    detecting at least one characteristic of said load; and
    determining said state of health of said electrochemical device from a fuzzy system trained in a relationship between said at least one characteristic of said electrochemical device and said at least one characteristic of said load and said state of health.

2. The method of determining said state of health of claim 1 wherein said fuzzy system comprises an additive fuzzy system.

3. The method of determining state of health of claim 1 wherein said electrochemical device comprises primary battery, a rechargeable battery, a fuel cell, a hybrid battery containing a fuel cell electrode or an electrochemical supercapacitor.

4. The method for determining said state of health of claim 1 wherein:
    said characteristic of said electrochemical device comprises a state of charge or a cycle number of said electrochemical device; and
    said characteristic of said load comprises power or energy requirements of said load.

5. The method for determining said state of health of claim 1 wherein said relationship comprises:

$$SOH = f(Z(f_1), Z(f_2), E, P)$$

where $Z(f_1)$ is an internal impedance of said electrochemical device at a first frequency $Z(f_2)$ is an internal impedance of said electrochemical device at a second frequency, E is the energy requirements of said load, and P is the power requirements of said load.

6. The method of determining said state of health of claim 1 wherein said at least one characteristic of said electrochemical device comprises at least one external characteristic.

7. The method of determining said state of health of claim 6 wherein said at least one external characteristic comprises an external operating condition and an environmental condition.

8. The method of determining said state of health of claim 1 wherein said at least one characteristic of said electrochemical device comprises at least one internal electrical characteristic.

9. The method of determining said state of health of claim 8 wherein said at least one internal electrical characteristic of said electrochemical device comprises at least one internal impedance of said electrochemical device.

10. The method of determining said state of health of claim 9 wherein said at least one internal impedance comprises a first internal impedance at a first frequency.

11. The method of determining said state of health of claim 10 wherein said at least one internal impedance further comprises a second internal impedance at a second frequency.

12. A system for determining a state of health of an electrochemical device connected to a load, comprising:
    a first sensor detecting at least one characteristic of said electrochemical device and
    providing a first sensed signal indicative thereof;
    a second sensor detecting at least one characteristic of said load and providing a second sensed signal indicative thereof; and
    a signal processor responsive to said first and second sensed signals for determining said state of health of said electrochemical device and providing a state of health signal, said signal processor including a fuzzy system trained in a relationship between said at least one characteristic of said electrochemical device and said at least one characteristic of said load and said state of health.

13. The system of determining said state of health of claim 12 wherein said fuzzy system comprises an additive fuzzy system.

14. The system of determining state of health of claim 12 wherein said electrochemical device comprises a primary battery, a rechargeable battery, a fuel cell, a hybrid battery containing a fuel cell electrode or an electrochemical supercapacitor.

15. The system for determining said state of health of claim 12 wherein:
    said characteristic of said electrochemical device comprised a state of charge or a cycle number of said electrochemical device; and
    said characteristic of said load comprises power or energy requirements of said load.

16. The system of for determining said state of health of claim 12 wherein said relationship comprises:

$$SOH = f(Z(f_1), Z(f_2), E, P)$$

where $Z(f_1)$ is an internal impedance of said electrochemical device at a first frequency $Z(f_2)$ is an internal impedance of said electrochemical device at a second frequency, E is the energy requirements of said load, and P is the power requirements of said load.

17. The system of determining state of health of claim 16 wherein said at least one external characteristic comprises an external operating condition and an environmental condition.

18. The system for determining state of health of claim 12 further comprising:

a display responsive to said state of health signal for displaying said state of health.

19. The system for determining said state of health of claim 12 wherein said at least one characteristic of said electrochemical device comprises at least one external characteristic.

20. The system for determining said state of health of claim 19 wherein said at least one external characteristic comprises an external operating condition and an environmental condition.

21. The system for determining said state of health of claim 12 wherein said at least one characteristic of said electrochemical device comprises at least one internal electrical characteristic.

22. The system for determining said state of health of claim 21 wherein said at least one internal electrical characteristic of said electrochemical device comprises at least one internal impedance of said electrochemical device.

23. The system of determining said state of health of claim 22 wherein said at least one internal impedance comprises a first internal impedance at a first frequency.

24. The system of determining said state of health of claim 23 wherein said at least one internal impedance further comprises a second internal impedance at a second frequency.

* * * * *